US012631669B2

(12) United States Patent
Qian et al.

(10) Patent No.: US 12,631,669 B2
(45) Date of Patent: May 19, 2026

(54) LOSSLESS EXCITING CURRENT SAMPLING CIRCUIT FOR ISOLATED CONVERTER

(71) Applicant: SOUTHEAST UNIVERSITY, Nanjing (CN)

(72) Inventors: Qinsong Qian, Nanjing (CN); Song Ding, Nanjing (CN); Chunyan Nie, Nanjing (CN); Yuanhang Zhou, Nanjing (CN); Weifeng Sun, Nanjing (CN); Longxing Shi, Nanjing (CN)

(73) Assignee: SOUTHEAST UNIVERSITY, Nanjing (CN)

( * ) Notice: Subject to any disclaimer, the term of this patent is extended or adjusted under 35 U.S.C. 154(b) by 330 days.

(21) Appl. No.: 18/567,382

(22) PCT Filed: Dec. 29, 2022

(86) PCT No.: PCT/CN2022/143355
§ 371 (c)(1),
(2) Date: Dec. 6, 2023

(87) PCT Pub. No.: WO2024/007555
PCT Pub. Date: Jan. 11, 2024

(65) Prior Publication Data
US 2025/0085315 A1 Mar. 13, 2025

(30) Foreign Application Priority Data
Jul. 8, 2022 (CN) .......................... 202210804497.7

(51) Int. Cl.
| | |
|---|---|
| *G01R 19/00* | (2006.01) |
| *H02M 1/00* | (2006.01) |
| *H02M 3/335* | (2006.01) |

(52) U.S. Cl.
CPC ...... *G01R 19/0053* (2013.01); *H02M 1/0009* (2021.05); *H02M 3/33592* (2013.01)

(58) Field of Classification Search
CPC . G01R 19/0053; G01R 19/00; H02M 1/0009; H02M 3/33592; H02M 3/1582; H02M 3/335
See application file for complete search history.

(56) References Cited

U.S. PATENT DOCUMENTS

| | | | |
|---|---|---|---|
| 2015/0381061 A1* | 12/2015 | Yan ....................... | H02M 3/335 363/21.02 |
| 2024/0348156 A1* | 10/2024 | Huang ................ | H02M 1/0009 |

FOREIGN PATENT DOCUMENTS

| | | |
|---|---|---|
| CN | 102590580 A | 7/2012 |
| CN | 204732856 U | 10/2015 |

(Continued)

*Primary Examiner* — Kyle J Moody
(74) *Attorney, Agent, or Firm* — Bayramoglu Law Offices, LLC

(57) ABSTRACT

A lossless exciting current sampling circuit for an isolated converter includes first and second voltage sampling circuits and a subtraction circuit formed by an operational amplifier. The two sampling circuits sample voltages of the primary winding of an isolation transformer, with outputs fed into the subtracter. The subtracter output is the circuit's output. RC low-pass filters with large time constants are used as primary voltage sampling circuits, realizing integration of voltage differences between the exciting inductance terminals, enabling lossless current sampling without resistors or transformers. The current sampling result is utilized for volt-second balance control, realized along with a hold circuit and comparator which compares the sampling hold result with the current sampling result to generate a control signal.

17 Claims, 6 Drawing Sheets

(56)     References Cited

FOREIGN PATENT DOCUMENTS

| | | | |
|---|---|---|---|
| CN | 105226916 | A | 1/2016 |
| CN | 108459650 | A | 8/2018 |
| CN | 114079414 | A | 2/2022 |
| CN | 115144642 | A | 10/2022 |
| JP | 2015223056 | A | 12/2015 |

* cited by examiner

LOSSLESS EXCITING CURRENT SAMPLING CIRCUIT FOR ISOLATED CONVERTER

CROSS REFERENCE TO THE RELATED APPLICATIONS

This application is the national phase entry of International Application No. PCT/CN2022/143355, filed on Dec. 29, 2022, which is based upon and claims priority to Chinese Patent Application No. 202210804497.7, filed on Jul. 10, 2022, the entire contents of which are incorporated herein by reference.

TECHNICAL FIELD

The invention relates to lossless current sampling techniques for isolated converters, and discloses a lossless exciting current sampling circuit for an isolated converter, which is suitable for exciting current sampling of DCM isolated converters and resonant isolated converters, and belongs to the technical field of basic electronic circuits.

BACKGROUND

With the constant improvement of modern power electronics techniques, the frequency, efficiency and power density are becoming increasingly higher, and switching power supplies mainly based on the power electronics techniques are developing towards minimization and high frequency continuously. High-power composite devices serving as key devices such as MOSFETs and IGBTs have a low capacity to withstand short-time overloads, so the devices are likely to be damaged due to breakdown caused by energy accumulation in case of overvoltage or overcurrent of power transistors. In actual application, a power transistor protection circuit should be designed to protect the devices against damage to guarantee normal operation of a whole system. The protection circuit detects some parameter indicators of the system by means of a device or a circuit structure, and then controls the turn-on/turn-off time of the power transistor through a control circuit to fulfill a protection function. Overcurrent protection is indispensable to DC-DC circuit design, so the current detection circuit is an important functional module in a power integrated circuit.

The current detection circuit is mainly used for monitoring the output current to obtain in real time the current operating state of a power supply. According to one common current sampling method, a sampling resistor or a current transformer is arranged on a current branch to be detected, which will produce an extra power loss, thus reducing the operating efficiency of the converter. According to another current sampling method, the current across a transistor is sampled by means of MOSFET—$R_{DS}$, which will not produce an extra power loss; however, due to the great influence of temperature or process, the current detection accuracy is low. All these methods are not suitable for circuits with high efficiency and accuracy requirements. Therefore, it is necessary to further improve existing current sampling schemes to satisfy the requirements for circuits with higher performance.

SUMMARY

The objective of the invention is to overcome the above-mentioned defects by providing a lossless exciting current sampling circuit for an isolated converter, which realizes lossless sampling of the exciting current of an isolated converter without a sampling resistor or a current transformer by performing filtering and integration on voltages of two terminals of a primary winding of the isolated converter by means of filters with a large time constant, thus solving the technical problem that existing lossless current detection circuits reduce the overall efficiency of the converter and are low in detection accuracy.

To fulfill the above objective, the invention adopts the following technical solution:

The invention provides a lossless exciting current sampling circuit for an isolated converter, wherein the isolated converter includes an isolation transformer, a primary winding of the isolation transformer is connected in parallel with a primary power conversion circuit, and a secondary winding of the isolation transformer is connected in parallel with a secondary circuit. An input terminal of the lossless exciting current sampling circuit is connected to a primary side of the isolation transformer and is used for sampling voltages of two terminals of the primary winding of the isolation transformer. An output terminal of the lossless exciting current sampling circuit is directly connected to one input terminal of a comparison circuit and is also connected to the other input terminal of the comparison circuit through a sampling hold circuit, and the comparison circuit outputs a control signal or protection signal for realizing volt-second balance to control the state of a power switch transistor so as to protect a system and peripheral devices.

The lossless exciting current sampling circuit includes a first voltage sampling circuit, a second voltage sampling circuit and a subtraction circuit formed by an operational amplifier. The first voltage sampling circuit and the second voltage sampling circuit sample the voltages of the two terminals of the primary winding of the isolation transformer respectively, which are marked as $V_a$ and $V_b$, and an exciting inductive current is sampled by detecting a difference ($V_a - V_b$) between the voltages of the two terminals of the primary winding of the isolation transformer. According to the relation between inductive voltage and current, $$V_L = L\frac{di_L}{dt},$$

that is, the exciting inductive current is obtained by calculating a difference between integral values with time of the voltages of the two terminals of the primary winding of the isolation transformer. So, RC low-pass filtering circuits (integrating circuits) with a large time constant are introduced to serve as the voltage sampling circuits. The voltages of the two terminals of the primary winding of the isolation transformer sampled by the first voltage sampling circuit and the second voltage sampling circuit are subjected to voltage division, filtering and integration to obtain final sampled output voltages $V_{aS}$ and $V_{bS}$, which are outputs of the first voltage sampling circuit and the second voltage sampling circuit. The outputs of the voltage sampling circuits are input to two input terminals of a subtracter respectively, an output terminal of the subtracter serves as the output terminal of the lossless exciting current sampling circuit, and an output of the lossless exciting current sampling circuit is marked as $V_{sen}$.

In the invention, a DC bias voltage is superposed at a forward input terminal of the subtracter, such that the output $V_{sen}$ of the lossless exciting current sampling circuit is an exciting inductive current superposed with a direct current.

In the invention, a circuit for realizing volt-second balance includes a sampling hold circuit and a comparison circuit. The sampling hold circuit is triggered by a pulse signal to perform sampling hold on the output $V_{sen}$ of the lossless exciting current sampling circuit during the pulse rising time, and a sampling hold result is marked as $V_{SH}$. A small positive slope wave is added to an output terminal of the sampling hold circuit to allow a power transistor under control to change the state in advance, such that system instabilities caused by delayed changing of the state are prevented. The output $V_{sen}$ of the lossless exciting current sampling circuit and the output $V_{SH}$ of the sampling hold circuit are input to two input terminals of the comparison circuit respectively, and when $V_{sen}$ changes into $V_{SH}$, the state of an output signal of the comparison circuit changes and an output of the comparison circuit is used as a power transistor control signal.

By adopting the above technical solution, the invention has the following beneficial effects:

(1) The invention abandons the traditional exciting inductive current sampling scheme using a resistor or a current transformer, and adopts the lossless exciting current sampling circuit for an isolated converter, which realizes lossless sampling of the exciting inductive current by directly sampling the voltages of the two terminals of the primary winding of the transformer in the isolated converter, such that an extra power loss is avoided, and the overall efficiency of the converter is improved; moreover, the invention abandons the scheme of detecting the exciting current by directing the current across an MOS transistor, and has the advantages of high detection accuracy.

(2) In the invention, RC circuits with a large time constant are used as sampling circuits for sampling the voltages of the primary winding of the isolated converter, by selecting the parameter of the RC circuits, the RC circuits not only have a low-pass frequency response function, but also have an integrating function, and can realize voltage division, filtering and integration of the voltages of the primary winding of the isolated converter to obtain a sampling signal with high-frequency noise being effectively filtered out.

(3) In the invention, two RC sampling circuits are used for sampling the voltages of the two terminals of the primary winding of the isolated converter respectively, and a bias voltage for eliminating an offset introduced to the difference between two sampling signals is superposed to the forward input terminal of the subtraction circuit for calculating and amplifying the difference between the two sampling signals, such that an effective value of the exciting inductive current can be sampled within the whole control cycle.

(4) The invention further provides a scheme for realizing volt-second balance of an exciting inductive current, which uses a lossless exciting current sampling signal as a reference signal and compares the reference signal with a reference signal obtained after sampling hold to obtain a control signal for keeping the turn-off time of a primary power transistor in the isolated converter consistent with the volt-second balance time of the exciting inductive current, such that a system and peripheral devices are protected.

REFERENCE SIGNS IN THE FIGURES $L_r$, primary leakage inductance; $L_m$, exciting inductance; $R_L$, equivalent loss resistance; R0, voltage dividing resistor; C0, filter capacitor; $C_{VSB}$, voltage hold capacitor; R1-R5, first to fifth resistors; $R_{up}$, pull-up resistor; OPA, operational amplifier; SW, switch; CMP, comparator.

Detailed Description of the Embodiments

The technical solution of the invention will be described in detail below in conjunction with accompanying drawings.

Figure 1:
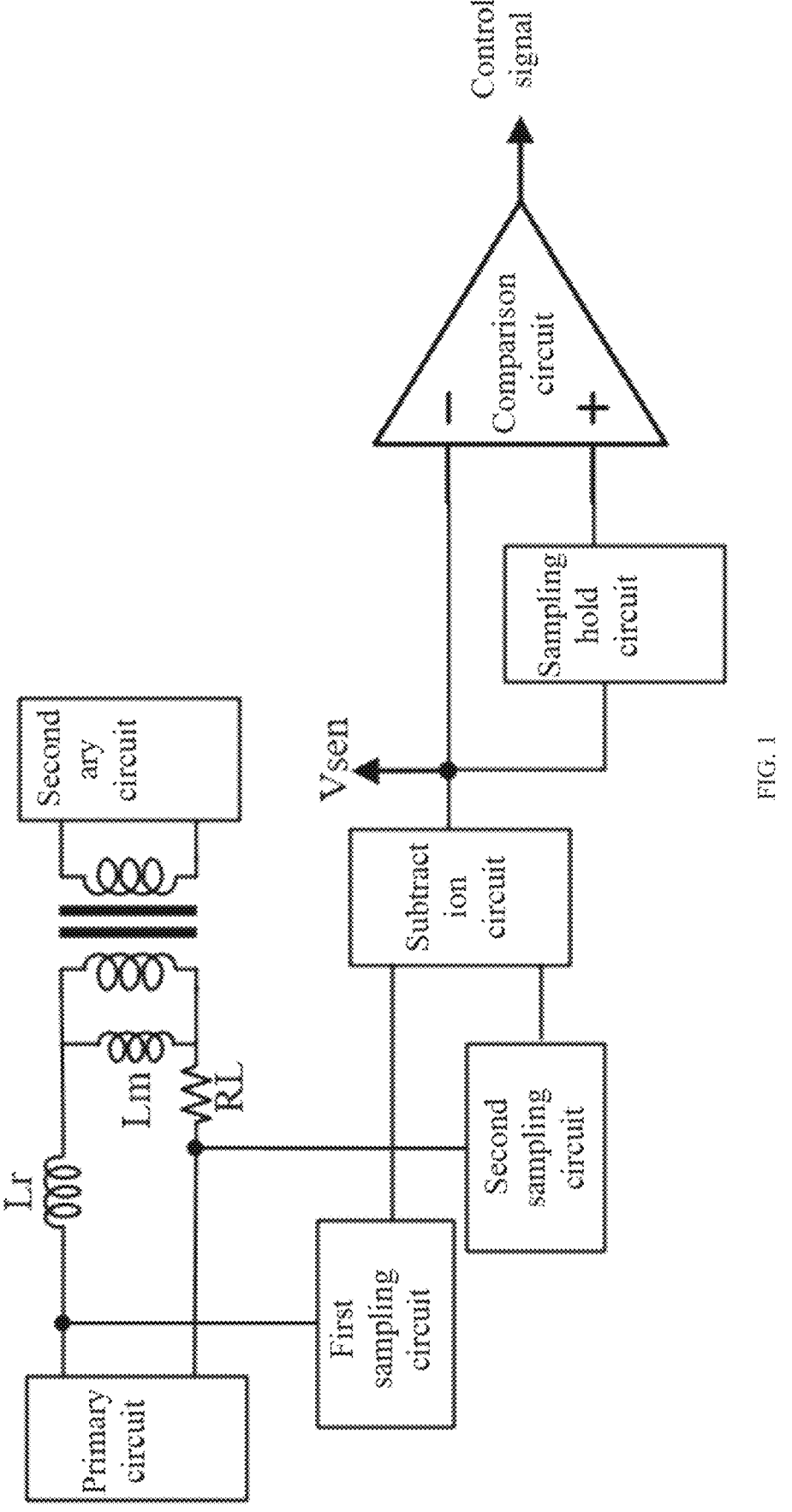
FIG. 1 is a principle block diagram of a lossless exciting current sampling circuit for an isolated converter and volt-second balance control according to the invention.

As shown in FIG. 1 which is a principle block diagram of a lossless exciting current sampling circuit and volt-second balance control according to the invention, an isolated converter includes an isolation transformer, wherein a primary winding of the isolation transformer is connected in parallel with a primary power conversion circuit, and a secondary winding of the isolation transformer is connected in parallel with a secondary circuit. The lossless exciting current sampling circuit performs voltage division, filtering and integration on voltages of two terminals of the primary winding of the isolation transformer to obtain sampling values of the voltages of the two terminals of the primary winding of the isolation transformer, and then amplifies and compensates for a difference between the sampling values of the voltages of the two terminals of the primary winding of the isolation transformer to obtain a voltage signal representing an exciting current. The lossless exciting current sampling circuit includes a first voltage sampling circuit, a second voltage sampling circuit and a subtraction circuit formed by an operational amplifier. The lossless exciting current sampling signal is applied to a volt-second balance control method, and a control signal is obtained by detecting the time when an increment in the cycle of the current sampling signal is 0. A circuit for realizing volt-second balance includes a sampling hold circuit and a comparison circuit. The isolated converter includes an isolation transformer, two terminals of a primary winding of the isolation transformer are marked as a terminal 1 and a terminal b respectively, voltages of the two terminals are $V_a$ and $V_b$ respectively, and the ratio of the number of turns of the primary winding of the isolation transformer to the number of turns of a secondary winding of the isolation transformer is $$N_{PS} = \frac{N_P}{N_S}.$$

A primary side of an equivalent circuit of the isolation transformer has an exciting inductance $L_m$, a primary leakage inductance $L_r$ and an equivalent loss resistance $R_L$, the exciting inductive current is denoted as $i_{L_m}$, and a secondary current is denoted as $i_{sec}$, so the difference between the voltages of the two terminals of the primary winding of the isolation transformer satisfies the following frequency-domain model:

$$V_a(s) - V_b(s) = i_{L_m}(s) \cdot (R_L + s(L_m + L_r)) - \frac{i_{sec}(s)}{N_{PS}} \cdot (R_L D + sL_r)$$

Figure 2:
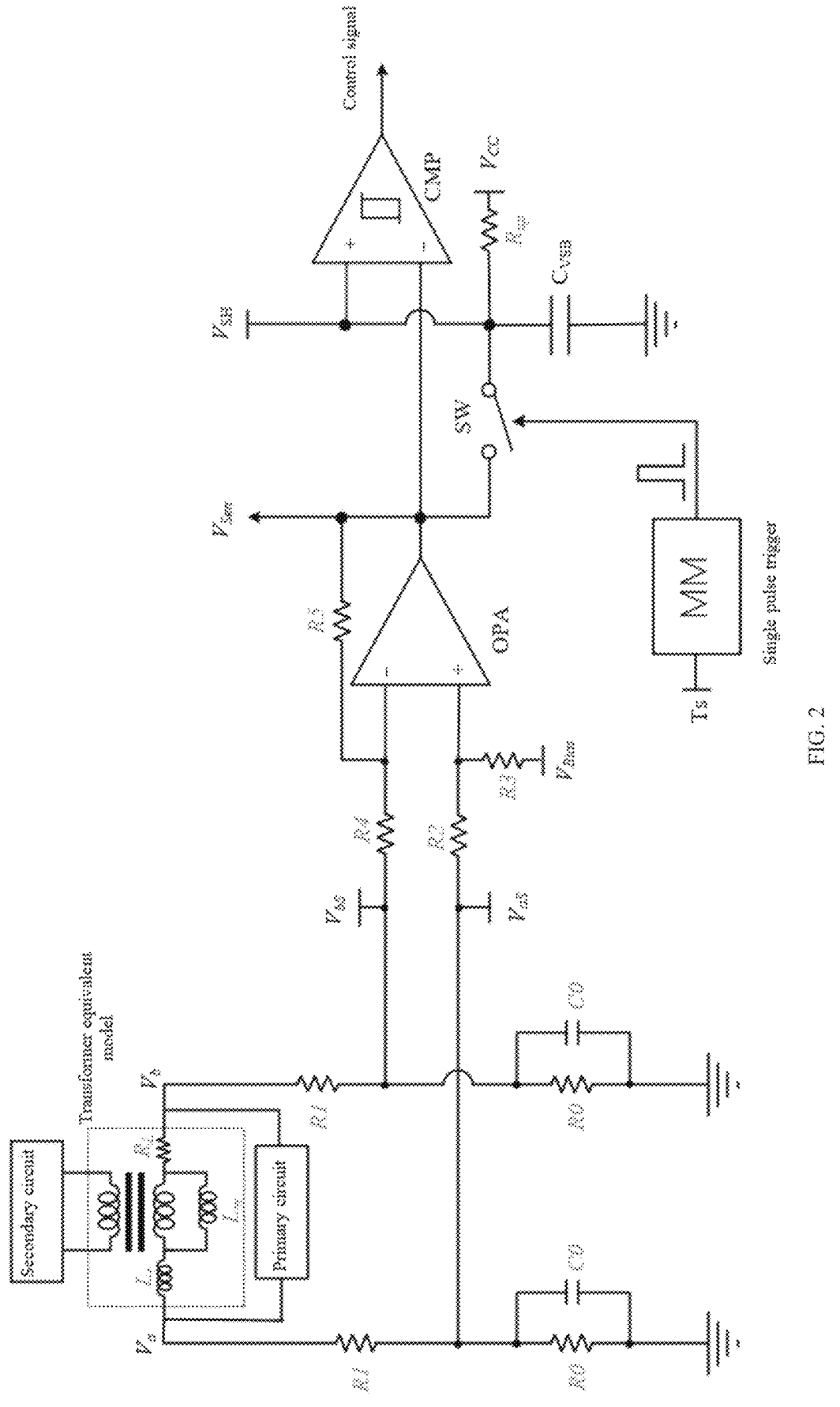
FIG. 2 is a specific circuit diagram of the lossless exciting current sampling circuit for an isolated converter and volt-second balance control according to one embodiment of the invention.

As shown in FIG. 2 which is a specific circuit diagram of the lossless exciting current sampling circuit in this embodiment, the lossless exciting current sampling circuit is connected to the primary side of the isolation transformer in the isolated converter, and includes a first voltage sampling circuit, a second voltage sampling circuit and a subtraction circuit. The first voltage sampling circuit is connected to the terminal a of the primary winding of the isolation transformer, and a sampling output terminal of the first voltage sampling circuit is connected to a forward input terminal of a subtracter. The second voltage sampling circuit is connected to the terminal b of the primary winding of the isolation transformer, and a sampling output terminal of the second voltage sampling circuit is connected to an inverted input terminal of the subtracter. An output terminal of the subtracter is an output terminal of the lossless exciting current sampling circuit.

The first voltage sampling circuit and the second voltage sampling circuit are both RC circuits with a large time constant to realize integration of detected voltages, wherein a first resistor $R_1$ and a voltage dividing resistor $R_0$ form a voltage dividing network to realize voltage division of the sampled voltage of the terminal a of the primary winding of the isolation transformer, and a filter capacitor $C_0$, the first resistor $R_1$ and the voltage dividing resistor $R_0$ form a low-pass filter circuit to filter out high-frequency noise. The two voltage sampling circuits sample the voltages $V_a$ and $V_b$ of the two terminals a and b of the primary winding of the isolation transformer respectively, and a sampling output frequency-domain model of the first voltage sampling circuit and the second voltage sampling circuit is obtained:

$$V_{aS}(s) = V_a(s) \cdot \frac{R_0}{R_0 + R_1} \cdot \frac{1}{\left(\frac{R_0 \times R_1}{R_0 + R_1}\right)C_0 s + 1}$$

$$V_{bS}(s) = V_b(s) \cdot \frac{R_0}{R_0 + R_1} \cdot \frac{1}{\left(\frac{R_0 \times R_1}{R_0 + R_1}\right)C_0 s + 1}$$

The difference between output signals of the two voltage sampling circuits satisfies the following expression:

$$V_{aS}(s) - V_{bS}(s) = \left[i_{L_m}(s) \cdot (R_L + s(L_m + L_r)) - \frac{i_{sec}(s)}{N_{PS}} \cdot (R_L + sL_r)\right] \cdot$$

-continued $$\frac{R_0}{R_0 + R_1} \cdot \frac{1}{\left(\frac{R_0 \times R_1}{R_0 + R_1}\right)C_0 s + 1}$$

Parameters of the first resistor $R_1$, the voltage dividing resistor $R_0$ and the filter capacitor $C_0$ are selected, and a pole of the RC filter is controlled between a zero $$\frac{R_L}{L_m + L_r}$$

and a $$\frac{R_L}{L_r}.$$

The frequency-domain model is transformed to a time domain to obtain:

$$V_{aS}(t) - V_{bS}(t) = \frac{R_0}{R_0 + R_1} \cdot \frac{1}{\left(\frac{R_0 \times R_1}{R_0 + R_1}\right)C_0} \cdot$$

$$\left\{\left[(L_m + L_r) \cdot i_{L_m}(t) + \left(R_L - \frac{L_m + L_r}{\left(\frac{R_0 \times R_1}{R_0 + R_1}\right)C_0}\right) \cdot i_{L_m}(t) \cdot e^{\left(\frac{1}{\left(\frac{R_0 \times R_1}{R_0 + R_1}\right)C_0}\right)t}\right] - \right.$$

$$\left.\left[L_r \cdot \frac{i_{sec}(s)}{N_{PS}} + \left(R_L - \frac{L_r}{\left(\frac{R_0 \times R_1}{R_0 + R_1}\right)C_0}\right) \cdot \frac{i_{sec}(s)}{N_{PS}} \cdot e^{\left(\frac{1}{\left(\frac{R_0 \times R_1}{R_0 + R_1}\right)C_0}\right)t}\right]\right\} \approx$$

$$\frac{R_0}{R_0 + R_1} \cdot \frac{L_m + L_r}{\left(\frac{R_0 \times R_1}{R_0 + R_1}\right)C_0} \cdot i_{L_m}(t) + V_{offset}$$

As can be known from the above expression, an offset $V_{offset}$ is introduced into the difference between the voltages output by the two sampling circuits, so in this embodiment, a DC bias voltage $V_{Bias}$ is superposed to the forward input terminal of the subtraction circuit to ensure that an output of the subtraction circuit is always a positive value. A forward input signal $V_+(t)$ of the subtraction circuit satisfies the following expression:

$$V_+(t) = \frac{R_3}{R_2 + R_3} \cdot V_{aS}(t) + \frac{R_2}{R_2 + R_3} \cdot V_{Bias}$$

The subtraction circuit is composed of a second resistor $R_2$, a third resistor $R_3$, a fourth resistor $R_4$, a fifth resistor $R_5$ and an operational amplifier OPA, and an output signal of the operational amplifier is calculated according to the characteristics of the operational amplifier:

$$V_{sen} = R_5 \cdot \frac{R_2 \times R_3}{R_2 + R_3} \cdot \frac{R_4 + R_5}{R_4 \times R_5} \cdot \left(\frac{V_{Bias}}{R_3} + \frac{V_{as}}{R_2}\right) - \frac{R_5}{R_4} \cdot V_{bS}$$

In the above expression, the resistance of the second resistor $R_2$, the third resistor $R_3$, the fourth resistor $R_4$, the fifth resistor $R_5$ satisfies $R_3 = R_5 = K*R_2 = K*R_4$, so:

7

$$V_{sen} =$$

$$V_{Bias} + K(V_{aS} - V_{bS}) \approx V_{Bias} + \frac{KR_0}{R_0 + R_1} \cdot \frac{L_m + L_r}{\left(\frac{R_0 \times R_1}{R_0 + R_1}\right)C_0} \cdot i_{L_m}(t) + KV_{offset}$$

Where, K is used for amplifying an exciting current signal obtained by sampling, and the value of K should ensure that the detected signal $V_{sen}$ is easy to distinguish.

It can be known from the above expression that the output result of the lossless exciting current sampling circuit is an exciting inductive current signal superposed with a direct-current component, wherein the DC bias voltage $V_{Bias}$ satisfies the following condition:

$$V_{Bias} > \left| \frac{KR_0}{R_0 + R_1} \cdot \frac{L_m + L_r}{\left(\frac{R_0 \times R_1}{R_0 + R_1}\right)C_0} \cdot i_{L_m-valley} + KV_{offset} \right|.$$

The specific circuit diagram of the lossless exciting current sampling circuit used for realizing volt-second balance is shown in FIG. 2. A circuit for realizing volt-second balance includes the lossless exciting current sampling circuit, a sampling hold circuit and a comparison circuit, wherein the comparison circuit is a quick comparator. The output $V_{sen}$ of the lossless exciting current sampling circuit is input to an inverted input terminal of the comparator CMP, and is also input to a forward input terminal of the comparator CMP through the sampling hold circuit. The sampling hold circuit includes a switch SW, a voltage hold capacitor $C_{VSB}$ and a pull-up resistor $R_{up}$. Wherein, the switch SW is triggered and controlled by a single pulse, and sampling hold is performed on the output $V_{sen}$ of the lossless exciting current sampling circuit by the voltage hold capacitor $C_{VSB}$ at the beginning of a cycle. According to a sampling hold signal $V_{SH}$, the voltage hold capacitor $C_{VSB}$ is charged by the pull-up resistor $R_{up}$ to obtain a small positive slope signal used for controlling the state of a power transistor to change in advance to prevent system instabilities caused by delayed changing of the state, wherein the pull-up resistor $R_{up}$ is a maximum resistor of a megohm level.

The sampling hold signal $V_{SH}$ output by the sampling hold circuit is input to the forward input terminal of the comparator CMP. The comparator compares $V_{sen}$ and $V_{SH}$: when $V_{sen}$ decreases to $V_{SH}$, the comparator outputs a high level to control the power transistor to be turned off.

Figure 3:
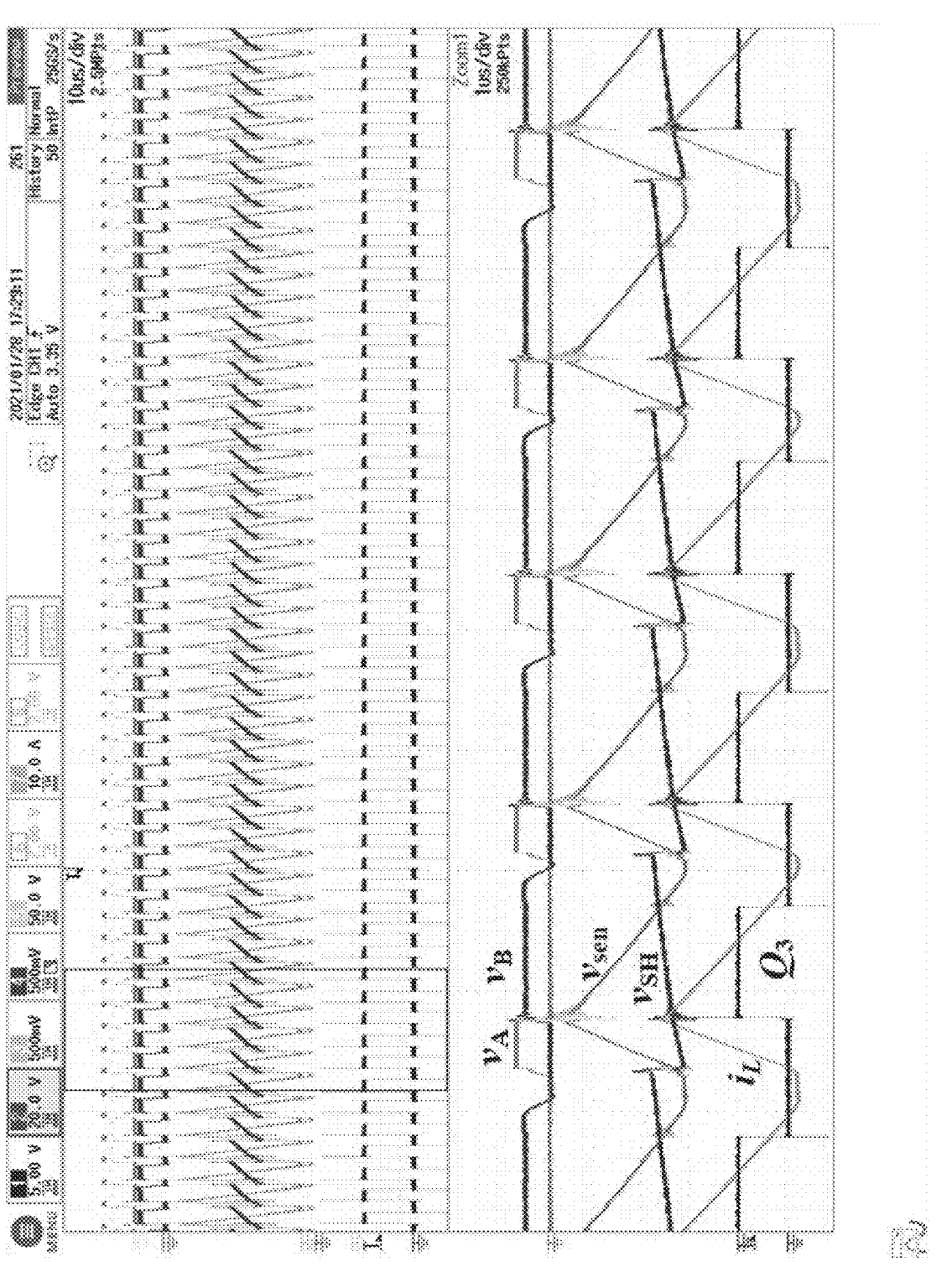
FIG. 3 is an oscillogram of an exciting inductive current of a buck-boost converter sampled by the lossless exciting current sampling circuit in a discontinuous conduction mode (DCM) according to one embodiment of the invention.
Figure 4:
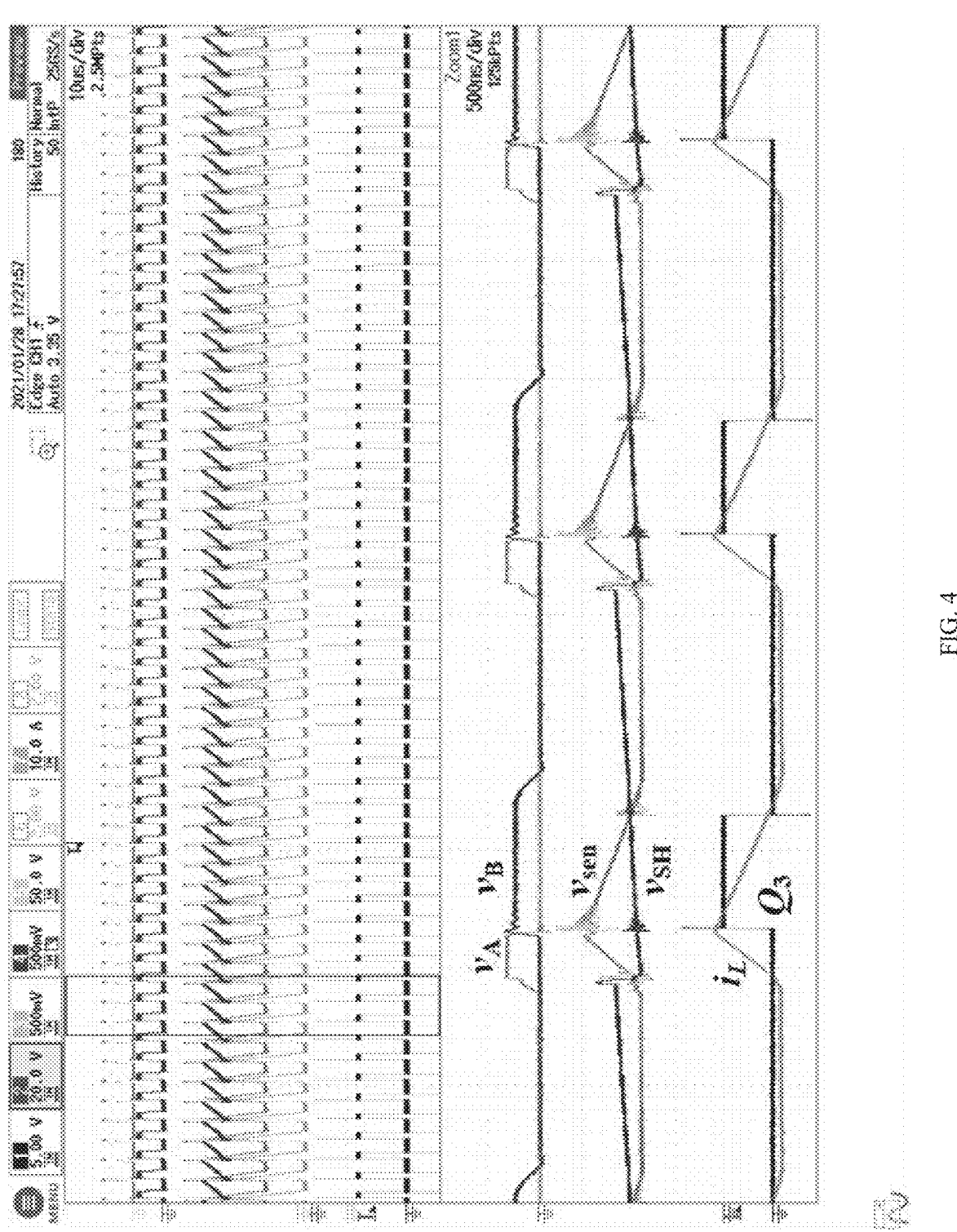
FIG. 4 is an oscillogram of an exciting inductive current of a buck-boost converter sampled by the lossless exciting current sampling circuit in a critical conduction mode (CrCM) according to one embodiment of the invention.

FIG. 3 and FIG. 4 are test diagrams of a four-switch buck-boost converter tested by the lossless exciting current sampling circuit in a discontinuous conduction mode (DCM) and a critical conduction mode (CrCM), where $V_{sen}$ is a voltage signal obtained by exciting current sampling, $V_{SH}$ is a voltage signal obtained by sampling hold, $i_L$ is an actual inductive current, and the falling edge of the signal Q3 is determined by the volt-second balance control circuit. It can be seen from FIG. 3 and FIG. 4 that the waveform of the exciting inductive current sampling signal $V_{sen}$ is accurate, and is consistent with the waveform of the actual exciting inductive current, and when the inductive current basically decreases to 0, the volt-second balance control circuit cuts off Q3, such that the deexciting process is ended.

Figure 5:
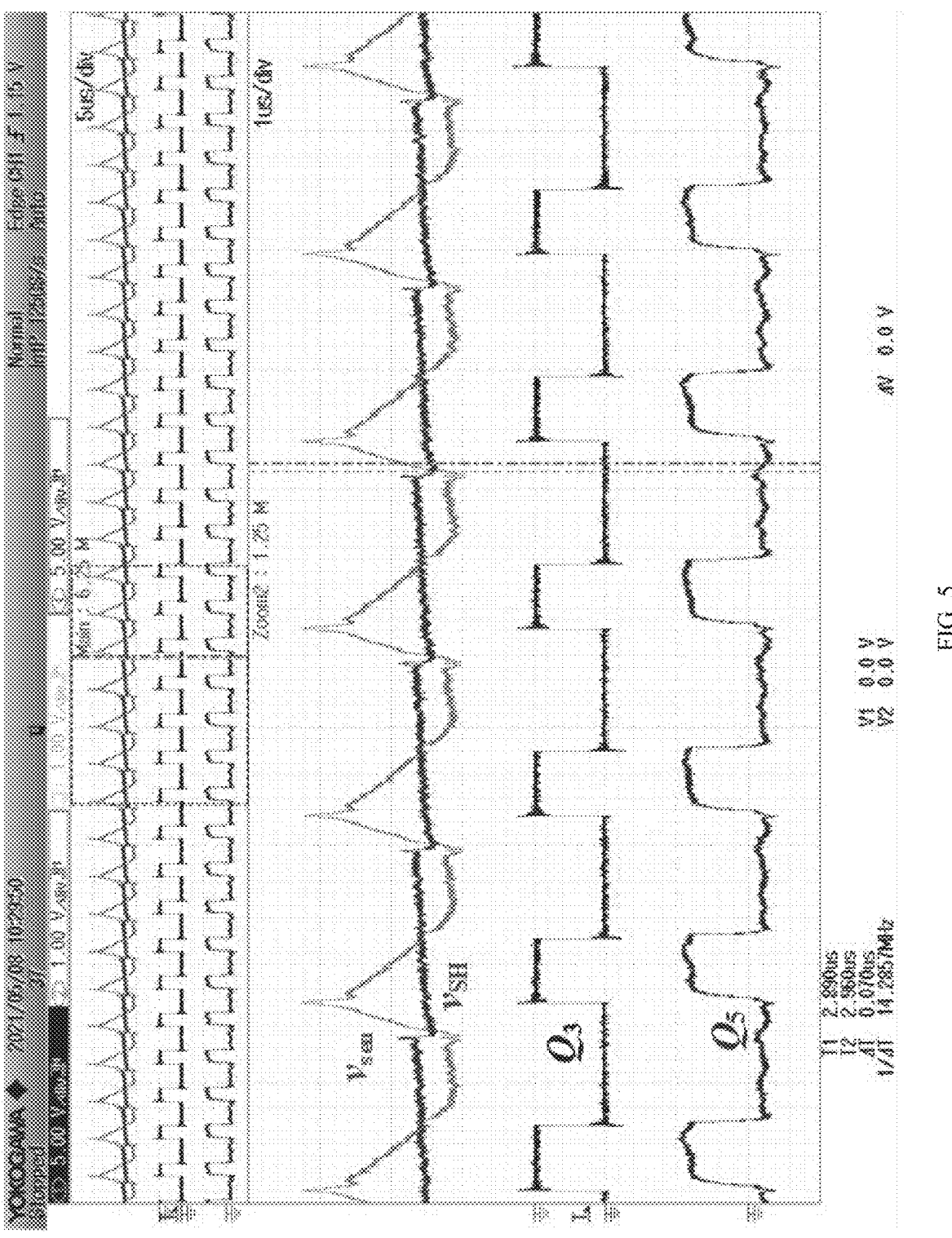
FIG. 5 is an oscillogram of an exciting inductive current of a flyback converter sampled by the lossless exciting current sampling circuit in a discontinuous conduction mode (DCM) according to one embodiment of the invention.
Figure 6:
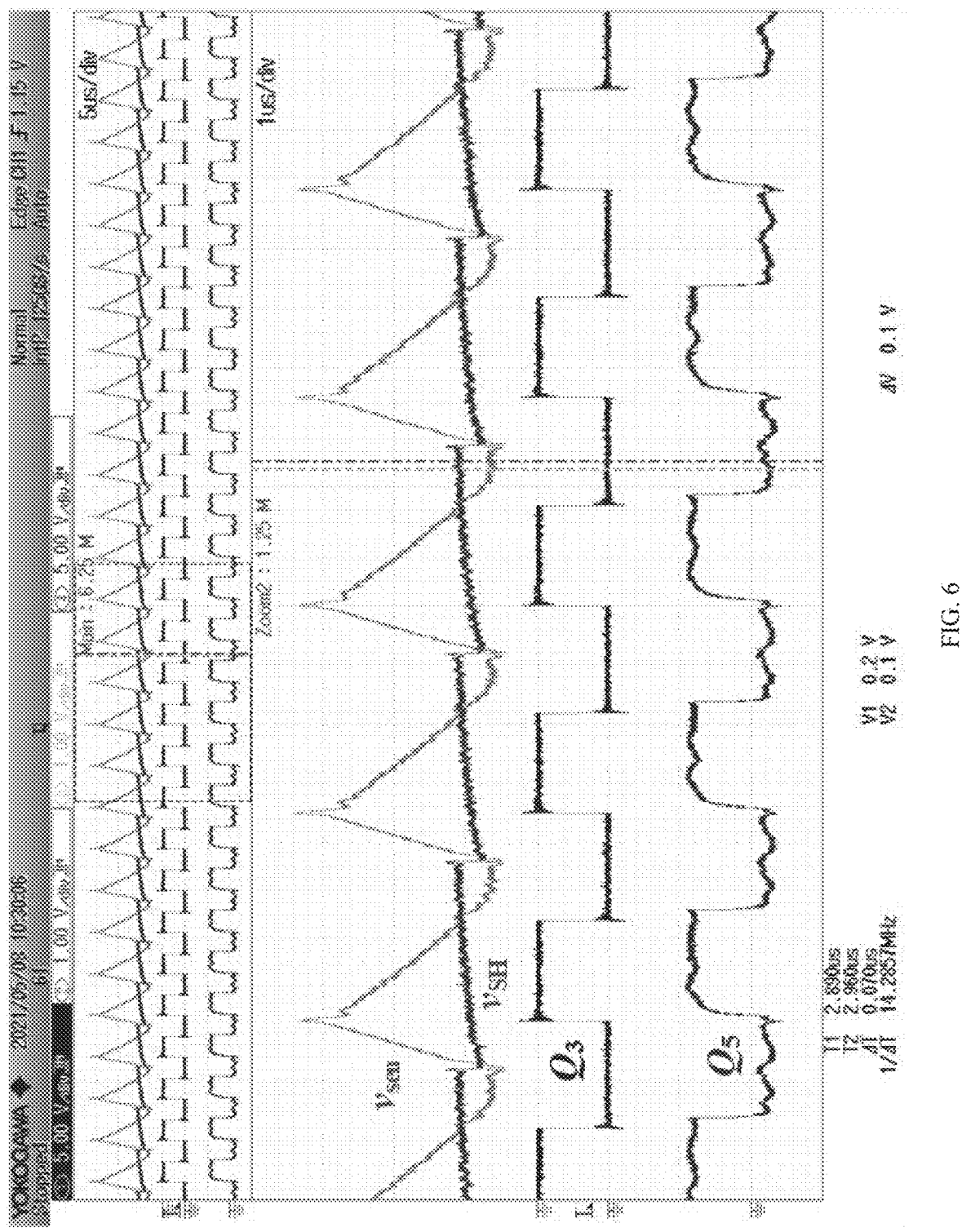
FIG. 6 is an oscillogram of an exciting inductive current of the flyback converter sampled by the lossless exciting current sampling circuit in a critical conduction mode (CrCM) according to one embodiment of the invention.

FIG. 5 and FIG. 6 are test diagrams of a flyback converter tested by the lossless exciting current sampling circuit in a discontinuous conduction mode (DCM) and a critical conduction mode (CrCM), and it can be seen from FIG. 5 and

8

FIG. 6 that the control signal (Q3) obtained by exciting current sampling is consistent with a secondary synchronous rectifying signal (Q5).

The above embodiments are merely used for explaining the invention by way of examples, and are not intended to limit the application. In addition, the invention may be implemented in other forms without departing from the spirit or basic features of the invention. The scope of the invention should be defined by the appended claims rather than the above description, and all changes obvious to those skilled in the art should fall within the scope of the appended claims.

What is claimed is:

1. A lossless exciting current sampling circuit for an isolated converter, comprising:

a first voltage sampling circuit connected to a current input terminal of a primary winding of an isolation transformer in an isolated converter and configured to perform sampling, filtering and integration on a voltage of the current input terminal of the primary winding of the isolation transformer to output a voltage sampling value of the current input terminal of the primary winding of the isolation transformer;

a second voltage sampling circuit connected to a current output terminal of the primary winding of the isolation transformer in the isolated converter and configured to perform sampling, filtering and integration on a voltage of the current output terminal of the primary winding of the isolation transformer to output a voltage sampling value of the current output terminal of the primary winding of the isolation transformer; and a subtraction circuit having a forward input terminal connected to an output terminal of the first voltage sampling circuit and an inverted input terminal connected to an output terminal of the second voltage sampling circuit, and configured to output an exciting inductive current sampling signal.

2. The lossless exciting current sampling circuit for the isolated converter according to claim 1, wherein the first voltage sampling circuit and the second voltage sampling circuit are identical, and each of the first voltage sampling circuit and the second voltage sampling circuit is an RC filter with a large time constant.

3. The lossless exciting current sampling circuit for the isolated converter according to claim 2, wherein the RC filter comprises a first resistor, a voltage dividing resistor and a filter capacitor, wherein a first terminal of the first resistor is connected to one terminal of the primary winding of the isolation transformer, a connection point of a first terminal of the voltage dividing resistor and a second terminal of the first resistor is the output terminal of the voltage sampling circuit, a second terminal of the voltage dividing resistor is grounded, and the filter capacitor is connected in parallel between the first terminal and the second terminal of the voltage dividing resistor.

4. The lossless exciting current sampling circuit for the isolated converter according to claim 3, wherein parameters of the first resistor, the voltage dividing resistor and the filter capacitor are determined according a principle that a pole $$\frac{1}{\left(\frac{R_0 \times R_1}{R_0 + R_1}\right)C_0}$$

of the RC filter is between a zero $$\frac{R_L}{L_m + L_r}$$

and a zero $$\frac{R_L}{L_r},$$

wherein $L_m$ is an exciting inductance, $R_L$ is an equivalent loss resistance, and $L_r$ is a primary leakage inductance.

5. The lossless exciting current sampling circuit for the isolated converter according to claim 4, wherein the subtraction circuit comprises a second resistor, a third resistor, a fourth resistor, a fifth resistor and an operational amplifier, wherein a first terminal of the second resistor is connected to the output terminal of the first voltage sampling circuit, a second terminal of the second resistor and a first terminal of the third resistor are connected to a forward input terminal of the operational amplifier, a DC bias voltage for counteracting an offset of a difference between an output signal of the first voltage sampling circuit and an output signal of the second voltage sampling circuit is input to a second terminal of the third resistor, a first terminal of the fourth resistor is connected to the output terminal of the second voltage sampling circuit, a second terminal of the fourth resistor and a first terminal of the fifth resistor are connected to an inverted input terminal of the operational amplifier, and a second terminal of the fifth resistor is connected to an output terminal of the operational amplifier.

6. The lossless exciting current sampling circuit for the isolated converter according to claim 5, wherein the DC bias voltage satisfies a constraint $$V_{Bias} > \left| \frac{KR_0}{R_0 + R_1} \cdot \frac{L_m + L_r}{\left(\frac{R_0 \times R_1}{R_0 + R_1}\right)C_0} \cdot i_{L_m-valley} + KV_{offset} \right|,$$

wherein $V_{Bias}$ is the DC bias voltage, K is an amplification factor, $i_{L_m-valley}$ is a valley of an exciting inductive current, and $V_{offset}$ is the offset of the difference between the output signal of the first voltage sampling circuit and the output signal of the second voltage sampling circuit.

7. The lossless exciting current sampling circuit for the isolated converter according to claim 6, wherein the exciting inductive current sampling signal output by the subtraction circuit is $$V_{sen} \approx V_{Bias} + \frac{KR_0}{R_0 + R_1} \cdot \frac{L_m + L_r}{\left(\frac{R_0 \times R_1}{R_0 + R_1}\right)C_0} \cdot i_{L_m}(t) + KV_{offset},$$

wherein $V_{sen}$ is the exciting inductive current sampling signal, and $i_{L_m}(t)$ is a time-domain signal of the exciting inductive current.

8. The lossless exciting current sampling circuit for the isolated converter according to claim 1, wherein the first voltage sampling circuit and the second voltage sampling circuit are identical, and each of the first voltage sampling circuit and the second voltage sampling circuit is a high-pass filter cascaded integrating circuit with a large time constant.

9. A control circuit for realizing volt-second balance of an exciting inductive current, comprising:

a sampling hold circuit, wherein the exciting inductive current sampling signal output by the lossless exciting current sampling circuit for the isolated converter according to claim 1 is input to an input terminal of the sampling hold circuit, and the sampling hold circuit outputs a sampling hold signal; and a comparison circuit, wherein the exciting inductive current sampling signal output by the lossless exciting current sampling circuit according to claim 1 is input to an inverted input terminal of the comparison circuit, the sampling hold signal output by the sampling hold circuit is input to a forward input terminal of the comparison circuit, and the comparison circuit outputs a control signal for turning off a power switch transistor in the primary circuit of the isolation transformer when the exciting inductive current sampling signal decreases to the sampling hold signal.

10. The control circuit for realizing volt-second balance of the exciting inductive current according to claim 9, wherein the sampling hold circuit comprises a switch, a voltage hold capacitor and a pull-up resistor, wherein a first terminal of the switch is used as an input terminal of the sampling hold circuit, a second terminal of the switch is connected to a positive plate of the voltage hold capacitor and a first terminal of the pull-up resistor and then is used as an output terminal of the sampling hold circuit, a single-pulse trigger signal is input to a control terminal of the switch, a negative plate of the voltage hold capacitor is grounded, and a second terminal of the pull-up resistor is connected to a DC voltage source.

11. The control circuit for realizing the volt-second balance of the exciting inductive current according to claim 9, wherein in the lossless exciting current sampling circuit, the first voltage sampling circuit and the second voltage sampling circuit are identical, and each of the first voltage sampling circuit and the second voltage sampling circuit is an RC filter with a large time constant.

12. The control circuit for realizing the volt-second balance of the exciting inductive current according to claim 11, wherein in the lossless exciting current sampling circuit, the RC filter comprises a first resistor, a voltage dividing resistor and a filter capacitor, wherein a first terminal of the first resistor is connected to one terminal of the primary winding of the isolation transformer, a connection point of a first terminal of the voltage dividing resistor and a second terminal of the first resistor is the output terminal of the voltage sampling circuit, a second terminal of the voltage dividing resistor is grounded, and the filter capacitor is connected in parallel between the first terminal and the second terminal of the voltage dividing resistor.

13. The control circuit for realizing the volt-second balance of the exciting inductive current according to claim 12, wherein in the lossless exciting current sampling circuit, parameters of the first resistor, the voltage dividing resistor and the filter capacitor are determined according a principle that a pole $$\frac{1}{\left(\frac{R_0 \times R_1}{R_0 + R_1}\right)C_0}$$

11 of the RC filter is between a zero $$\frac{R_L}{L_m + L_r}$$

and a zero $$\frac{R_L}{L_r},$$

wherein $L_m$ is an exciting inductance, $R_L$ is an equivalent loss resistance, and $L_r$ is a primary leakage inductance.

14. The control circuit for realizing the volt-second balance of the exciting inductive current according to claim 13, wherein in the lossless exciting current sampling circuit, the subtraction circuit comprises a second resistor, a third resistor, a fourth resistor, a fifth resistor and an operational amplifier, wherein a first terminal of the second resistor is connected to the output terminal of the first voltage sampling circuit, a second terminal of the second resistor and a first terminal of the third resistor are connected to a forward input terminal of the operational amplifier, a DC bias voltage for counteracting an offset of a difference between an output signal of the first voltage sampling circuit and an output signal of the second voltage sampling circuit is input to a second terminal of the third resistor, a first terminal of the fourth resistor is connected to the output terminal of the second voltage sampling circuit, a second terminal of the fourth resistor and a first terminal of the fifth resistor are connected to an inverted input terminal of the operational amplifier, and a second terminal of the fifth resistor is connected to an output terminal of the operational amplifier.

15. The control circuit for realizing the volt-second balance of the exciting inductive current according to claim 14, wherein in the lossless exciting current sampling circuit, the DC bias voltage satisfies a constraint:

$$V_{Bias} > \left| \frac{KR_0}{R_0 + R_1} \cdot \frac{L_m + L_r}{\left(\frac{R_0 \times R_1}{R_0 + R_1}\right)C_0} \cdot i_{L_m-valley} + KV_{offset} \right|,$$

wherein $V_{Bias}$ is the DC bias voltage, K is an amplification factor, $i_{L_m\_valley}$ is a valley of an exciting inductive current, and $V_{offset}$ is the offset of the difference between the output signal of the first voltage sampling circuit and the output signal of the second voltage sampling circuit.

16. The control circuit for realizing the volt-second balance of the exciting inductive current according to claim 15, wherein in the lossless exciting current sampling circuit, the exciting inductive current sampling signal output by the subtraction circuit is $$V_{sen} \approx V_{Bias} + \frac{KR_0}{R_0 + R_1} \cdot \frac{L_m + L_r}{\left(\frac{R_0 \times R_1}{R_0 + R_1}\right)C_0} \cdot i_{L_m}(t) + KV_{offset},$$

wherein $V_{sen}$ is the exciting inductive current sampling signal, and $i_{L_m}(t)$ is a time-domain signal of the exciting inductive current.

17. The control circuit for realizing the volt-second balance of the exciting inductive current according to claim 9, wherein in the lossless exciting current sampling circuit, the first voltage sampling circuit and the second voltage sampling circuit are identical, and each of the first voltage sampling circuit and the second voltage sampling circuit is a high-pass filter cascaded integrating circuit with a large time constant.

* * * * *